(12) United States Patent
Mitta et al.

(10) Patent No.: US 10,439,094 B2
(45) Date of Patent: Oct. 8, 2019

(54) METHOD FOR MANUFACTURING SOLAR CELL ELEMENT AND SOLAR CELL ELEMENT

(75) Inventors: Ryo Mitta, Annaka (JP); Yoko Endo, Annaka (JP); Takenori Watabe, Annaka (JP); Hiroyuki Otsuka, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 39 days.

(21) Appl. No.: 13/997,341

(22) PCT Filed: Dec. 21, 2011

(86) PCT No.: PCT/JP2011/079671
§ 371 (c)(1),
(2), (4) Date: Jun. 24, 2013

(87) PCT Pub. No.: WO2012/086701
PCT Pub. Date: Jun. 28, 2012

(65) Prior Publication Data
US 2013/0284263 A1    Oct. 31, 2013

(30) Foreign Application Priority Data
Dec. 24, 2010 (JP) .................... 2010-288062

(51) Int. Cl.
*H01L 31/18* (2006.01)
*H01L 31/0224* (2006.01)

(52) U.S. Cl.
CPC ...... *H01L 31/18* (2013.01); *H01L 31/022425* (2013.01); *B41P 2215/50* (2013.01); *Y02E 10/50* (2013.01)

(58) Field of Classification Search
CPC ..... Y02E 10/50; Y02E 10/549; Y02E 10/547; Y02E 10/541; H01L 31/022425; H01L 31/18; H01L 31/022433
(Continued)

(56) References Cited

U.S. PATENT DOCUMENTS 6,091,019 A * 7/2000 Sakata ............ H01L 31/022425
136/256
2009/0285979 A1   11/2009 Karakida et al.
(Continued)

FOREIGN PATENT DOCUMENTS

JP       2010-090211 A    4/2010
JP       2010-103572 A    5/2010
(Continued)

OTHER PUBLICATIONS

Howard D. Goldberg, Richard B. Brown, Dong P. Liu, Mark E. Meyerho, "Screen printing: a technology for the batch fabrication of integrated chemical-sensor arrays", Sensors and Actuators B 21 (1994) 171-183.*
(Continued)

*Primary Examiner* — Mayla Gonzalez Ramos
(74) *Attorney, Agent, or Firm* — Westerman, Hattori, Daniels & Adrian, LLP

(57) ABSTRACT

Provided is a method for manufacturing a solar cell element that can increase the film thickness for collector electrodes formed in a screen printing process and reduce the resistance value of the same as well as contribute to improvements in conversion efficiency. When a collector electrode for a solar cell element is formed by screen printing of a conductive paste, that screen-printing process is repeated a plurality of times. At this time, the squeegee speed during the second or later screen printing is faster than the squeegee speed during the first screen printing. The second and later screen printing
(Continued)

is superimposed on the collector electrode printed the first time; therefore, the faster the squeegee speed is, the better the plate release is for the paste and foundation. The amount of paste applied increases, and the film for the collector electrode that is formed becomes thicker.

10 Claims, 1 Drawing Sheet

(58) Field of Classification Search
USPC .......................... 136/256, 244, 261; 438/98
See application file for complete search history.

(56) References Cited

U.S. PATENT DOCUMENTS

| | | | |
|---|---|---|---|
| 2010/0018577 A1* | 1/2010 | Nishiwaki et al. | 136/256 |
| 2010/0178726 A1* | 7/2010 | Sakamoto | H01B 1/22 438/98 |
| 2010/0294359 A1* | 11/2010 | Anderson | C03C 8/02 136/256 |
| 2011/0056552 A1* | 3/2011 | Fujishima | 136/256 |
| 2011/0192457 A1* | 8/2011 | Nakayama | H01B 1/22 136/256 |
| 2011/0214718 A1* | 9/2011 | Hayashi | 136/252 |

FOREIGN PATENT DOCUMENTS

| | | |
|---|---|---|
| JP | 2010-161178 A | 7/2010 |
| JP | 2010-199034 A | 9/2010 |

OTHER PUBLICATIONS

"Understanding and Development of Manufacturable Screen-Printed Contacts on High Sheet-Resistance Emitters for Low-Cost Silicon Solar Cells", Mohamed M. Hilali. (Year: 2005).*
International Search Report for PCT/JP2011/079671, dated Feb. 7, 2012.
Office Action dated Apr. 7, 2014, issued in European Patent Application No. 11850435.6-1508/2657979 (5 pages).
Singaporean Office Action dated Jun. 24, 2014, issued in corresponding Singaporean Patent Application No. 2013048988 (8 pages).
Galiazzo, M. et al, "New Technologies for Improvement of Metallization Line", 24th European Photovoltaic Solar Energy Conference and Exhibition; Conference Sep. 21-25, 2009, Exhibition Sep. 21-24, 2009, Hamburg; Proceedings; EU PVSEC, WIP-RENE, Sep. 21, 2009, pp. 1502-1505.
Raabe, B. et al, "High Aspect Ratio Screen Printed Fingers", 20th European Photovoltaic Solar Energy Conference, Proceedings of the 20th International Conference, WIP—Renewable Energies, Jun. 6, 2005, pp. 930-933.
Office Action dated Sep. 23, 2016, issued in counterpart European Application No. 11850435.6. (6 pages).

* cited by examiner

METHOD FOR MANUFACTURING SOLAR CELL ELEMENT AND SOLAR CELL ELEMENT

TECHNICAL FIELD

This invention relates to a method for manufacturing solar cells, and solar cells obtained therefrom.

BACKGROUND ART

In general, conventional solar cells have the structure shown in FIG. 1. In FIG. 1, a p-type semiconductor substrate 1 is typically a plate of poly- or monocrystalline silicon dimensioned 100 to 150 mm squares by 0.1 to 0.3 mm thick which is doped with a p-type impurity such as boron. On the substrate 1, an n-type diffusion layer 2 is formed by doping it with an n-type impurity such as phosphorus, and an antireflection film 3 of silicon nitride (SiN) or the like is formed. On the back surface, a back electrode 6 and a back-surface field (BSF) layer 4 are formed at the same time by printing a conductive aluminum paste thereto by screen printing technique, drying and firing. On the front surface, a collector electrode (or front electrode) 5 is formed by printing a conductive silver paste thereto, drying and firing. A solar cell is manufactured in this way. It is noted that the front surface refers to one surface of a substrate serving as the light-receiving side of a solar cell and the back surface refers to another surface of the substrate opposite to the light-receiving side.

When the collector electrode is formed by the screen printing technique, a single printing step is limited to a thickness of 30 μm at maximum relative to a line width of 100 μm, with a substantial thickness variation. The electrode resistance thus increases, becoming a deleterious factor against an improvement in conversion efficiency.

For the purpose of reducing the resistance value of a collector electrode, a method of forming a collector electrode by repeating screen printing plural times and using a mesh screen of different pattern in each of plural screen printing steps is under study (see, for example, JP-A 2010-103572). The solar cell manufactured by such a method generally has the structure shown in FIG. 2. As a result of overlay printing, the front electrode has an increased height. In FIG. 2, the front electrode includes a second layer 7.

However, if the mesh screens have different patterns, with which the degree of spreading under a printing pressure applied differs, the precision of printing is adversely affected. It is difficult to overlay collector electrode layers accurately. A misregistration occurs between collector electrode layers, resulting in a solar cell with low conversion efficiency or an appearance problem due to local thickening of collector electrode.

SUMMARY OF INVENTION

Technical Problem

While the invention is made under the above circumstances, its object is to provide a solar cell and manufacturing method, which can form a collector electrode by precision printing, reduce its resistance value, improve electrical properties, and reduce the takt time of manufacture.

Solution to Problem

Making extensive investigations to attain the above object, the inventors have found that when a collector electrode is formed by repeating screen printing plural times, the resistance value of the collector electrode can be reduced by setting such that the squeegee speed during second and later screen printing steps is equal to or higher than the squeegee speed during first screen printing step. This prevents any misregistration between collector electrode layers due to a change of the mesh screen pattern and enables reduction of the takt time. It is advantageous for the fabrication of solar cells that the collector electrode is formed by the screen printing process that enables to reduce the takt time without detracting from reliability and outer appearance. The invention is predicated on this finding.

Accordingly, the invention provides a method for manufacturing a solar cell having a collector electrode, characterized in that the collector electrode is formed by screen printing of a conductive paste at a collector electrode-forming site, and the screen-printing step is repeated plural times in an overlapping manner, wherein the squeegee speed during the second and later screen printing steps is equal to or higher than the squeegee speed during the first screen printing step; and a solar cell manufactured by the method.

In a preferred embodiment, the value obtained by subtracting the squeegee speed during the first screen printing step from the squeegee speed during the second and later screen printing steps is 0 mm/sec to 300 mm/sec.

Advantageous Effects of Invention

In the method for manufacturing a solar cell by screen printing a collector electrode according to the invention, second and later collector electrode printing steps are carried out at a speed equal to or higher than the speed of first collector electrode printing step, whereby electrical properties of the solar cell can be improved without detracting from reliability and outer appearance, and the takt time for solar cell manufacture can be reduced. The invention can be widely utilized in the manufacture of solar cells having improved electrical properties.

DESCRIPTION OF EMBODIMENTS

One embodiment of the invention is described below in detail. However, the invention can be implemented in a wide variety of other embodiments as well as the illustrated embodiment. The scope of the invention is not limited to the illustrated embodiment and should be construed as being limited only by the appended claims. The drawings are not drawn to scale. For clarifying the description and helping understanding of the invention, some components are drawn in exaggerated scale, and some components of no significance are not depicted.

As mentioned previously, FIG. 1 is a cross-sectional view illustrating the general structure of a solar cell. Illustrated in FIG. 1 are semiconductor substrate 1 diffusion layer for diffusion region) 2, antireflection/passivation film 3, BSF layer 4, collector electrode (or front electrode) 5, and back electrode 6.

Figure 1:
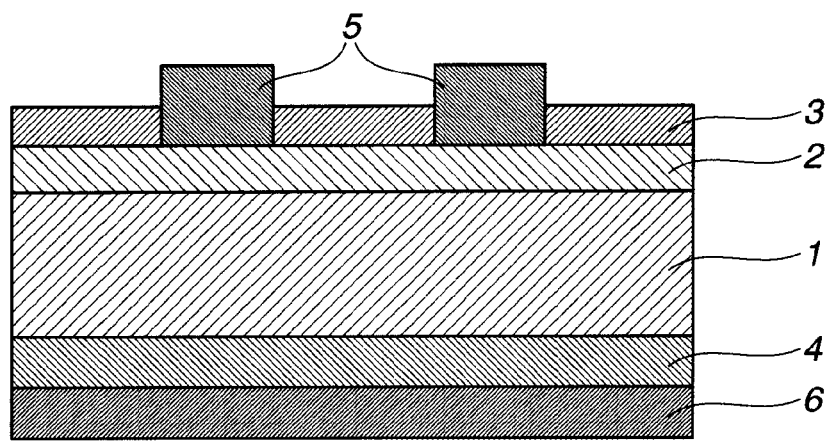
FIG. 1 is a cross-sectional view illustrating the structure of a solar cell.
Figure 2:
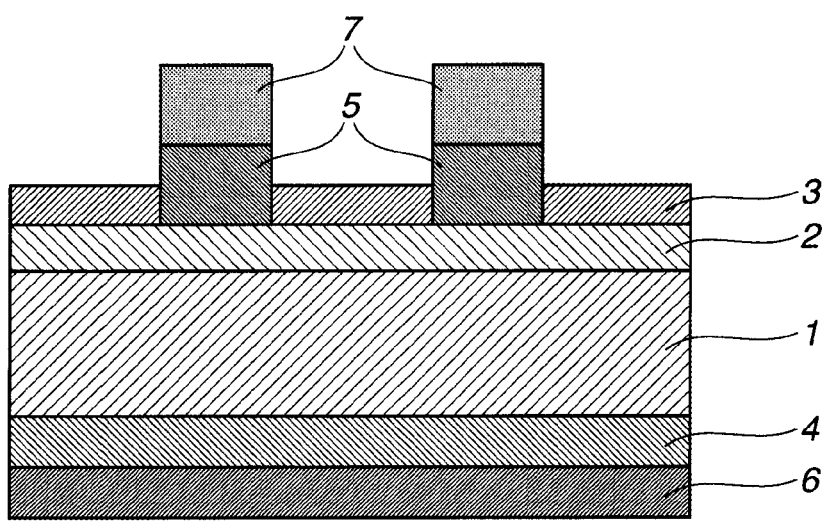
FIG. 2 is a cross-sectional view illustrating the structure of a solar cell in which a front electrode is formed by plural steps of screen printing.

Now the method for manufacturing the solar cell shown in FIG. 1 is described.

First, a semiconductor substrate 1 is provided. The semiconductor substrate 1 is made of poly- or monocrystalline silicon and may be of p- or n-type. Most often the semiconductor substrate 1 is a p-type silicon substrate doped with a p-type impurity such as boron and having a resistivity of 0.1 to 4.0 Ω·cm.

The method for manufacturing the solar cell is described below by referring to an embodiment using a p-type silicon substrate. A plate-shaped substrate dimensioned 100 to 150 mm squares by 0.05 to 0.30 mm thick is preferably used. After a surface layer damaged by slicing or otherwise machining is removed by immersing in acidic solution, for example, the front surface of p-type silicon substrate to serve as the light-receiving surface of a solar cell is provided with an irregular structure, known as texture, by chemical etching in alkaline solution, washing and drying. The irregular structure provides for multiple reflection of light at the light-receiving surface of the solar cell. Then the provision of an irregular structure is an effective means for reducing reflectivity and improving conversion efficiency.

Thereafter, the p-type silicon substrate is placed in a hot gas containing $POCl_3$, for example, at or above about 850° C., where thermal diffusion is performed to diffuse an n-type impurity such as phosphorus into the entire surface of the p-type silicon substrate, forming an n-type diffusion layer 2 having a sheet resistance of about 30 to 300 ohm/square (Ω/□) in the substrate surface. It is noted that when an n-type diffusion layer is formed by thermal diffusion, the n-type diffusion layer may be formed on the opposed surfaces and even the edge surfaces of p-type silicon substrate. In this case, the unnecessary n-type diffusion layer may be removed by immersing in fluoronitric acid solution the p-type silicon substrate with the necessary n-type diffusion layer covered with an acid resistant resin. Thereafter, a glass layer formed on the semiconductor substrate surface during diffusion is removed by immersing the substrate in a chemical solution such as dilute hydrofluoric acid, followed by washing with deionized water.

Next, an antireflection/passivation film 3 is formed on the front surface of p-type silicon substrate. This antireflection/passivation film may be formed of SiN, for example, by a plasma-enhanced CVD technique involving diluting a gas mixture of $SiH_4$ and $NH_3$ with $N_2$, producing a plasma through glow discharge decomposition and depositing. The antireflection/passivation film is formed such that it may have a refractive index of about 1.8 to 2.3, with a difference in refractive index from the p-type silicon substrate taken into account, and has a thickness of about 500 to 1,000 Å. It is formed for the purpose of preventing light from being reflected at the front surface of p-type silicon substrate and effectively taking light into the p-type silicon substrate. The SiN also functions as a passivation film capable of exerting a passivation effect to the n-type diffusion layer during its formation. This function, combined with the antireflection function, is effective for improving solar cell electrical properties.

Next, on the back surface, a conductive paste containing aluminum, glass frit and varnish, for example, is screen printed and dried. Then, on the front surface, a conductive paste containing silver, glass frit and varnish, for example, is screen printed and dried. Thereafter, the electrode-forming pastes are fired at a temperature of about 500 to 950° C. to form BSF layer 4, front electrode (i.e., collector electrode) 5 and back electrode 6.

From the typical method for manufacturing crystalline silicon solar cells as illustrated above, solar cells with good electrical properties are not obtainable because the collector electrode has a high resistance value. The method for manufacturing a solar cell according to the invention is characterized in that after the step of forming collector electrode by the above-mentioned screen printing technique, screen printing of a conductive paste at the collector electrode-forming site is repeated plural times at a squeegee speed which is equal to or higher than the squeegee speed during the first screen printing step whereby electrical properties of the solar cell are enhanced. Electrical properties of the solar cell are enhanced by the screen printing steps for the following reason.

In the case of typical screen printing, a first step of forming a collector electrode by printing a conductive paste containing silver and the like uses a squeegee speed of 50 to 300 mm/sec. A lower squeegee speed below the range may interfere with removal of the printing plate from the silicon substrate, i.e., the work to be printed and the paste, giving rise to problems like smearing of the paste and varying thickness of paste film. A higher squeegee speed above the range may lead to rapid removal of the printing plate, giving rise to problems like insufficient transfer of the paste to the silicon substrate, blurring of collector electrode, and thinning of paste film. However, in the case of formation of collector electrode by performing second and later steps of screen printing in an overlapping manner, since the work to be printed is the first layer of collector electrode rather than the silicon substrate, the state of removal of the printing plate from the work to be printed and the paste is different from that of the first printing step. As compared with the silicon substrate surface, the first layer of collector electrode presents a rough surface state, which is compatible with varnish and other ingredients in the paste. Then printing second and subsequent layers at a higher squeegee speed than the speed during the step of printing the first layer of collector electrode facilitates removal of the printing plate from the paste and the underlay, and increases the buildup of paste. The resulting collector electrode has an increased thickness and a reduced resistance value. A solar cell with enhanced electrical properties is obtainable.

In this embodiment, the value obtained by subtracting the squeegee speed during the first screen printing step from the squeegee speed during the second and later screen printing steps is 0 mm/sec to 300 mm/sec, preferably 10 mm/sec to 100 mm/sec, and more preferably 40 mm/sec to 80 mm/sec.

Likewise, where third and later screen printing steps are performed, the difference between the squeegee speed of a screen printing step and the squeegee speed of the preceding screen printing step is preferably 10 mm/sec to 100 mm/sec, more preferably 40 mm/sec to 80 mm/sec.

The mesh screen used in screen printing preferably bears the same pattern for all steps of screen printing.

It is noted that when a collector electrode is formed by screen printing, a layer of collector electrode is preferably formed by each screen printing step so as to have a thickness of 5 to 50 μm, especially 8 to 35 μm. The layers are preferably formed such that the collector electrode may have a total thickness of 25 to 70 μm for three-layer electrode and 30 to 90 μm for four-layer electrode.

The ink used in screen printing may be selected from well-known ink compositions, typically well-known conductive silver pastes. Screen printing may be performed in a standard way except that the squeegee speed is controlled as specified above.

EXAMPLES

Examples and Comparative Examples are given below for illustrating the invention although the invention is not limited thereto.

Example 1 and Comparative Example 1

A p-type silicon substrate was prepared by slicing boron-doped p-type monocrystalline silicon having a resistivity of about 1 Ω·cm to a thickness of 0.2 mm and machined along outer diameter, yielding a square plate of 15 cm squares. The p-type silicon substrate was immersed in a fluoronitric acid solution for 15 seconds to etch away the work damaged layer, chemically etched in a solution of 2 wt % KOH and 2 wt % IPA at 70° C. for 5 minutes, washed with deionized water and dried, to form a texture on the front surface of p-type silicon substrate. Next, the p-type silicon substrate was subjected to thermal diffusion in a $POCl_3$ gas atmosphere at a temperature of 870° C. for 30 minutes, to form an n-type layer in the substrate. At this point, the n-type layer had a sheet resistance of about 40Ω/□ and a depth of 0.4 μm. Once the n-type layer was covered with an acid resistant resin, the p-type silicon substrate was immersed in fluoronitric acid solution for 10 seconds to remove a portion of the n-type layer not covered with the acid resistant resin. The acid resistant resin was then removed, yielding the p-type silicon substrate having the n-type layer formed only on the front surface. Next, by plasma-enhanced CVD using $SiH_4$, $NH_3$ and $N_2$, SiN serving as an antireflection/passivation film was formed on the front surface of p-type silicon substrate having the n-type layer thereon to a thickness of 1,000 Å. Next, on the back surface of p-type silicon substrate, a conductive aluminum paste was printed and dried at 150° C.

Thereafter, on the front surface of p-type silicon substrate, by screen printing of a conductive silver paste, a collector electrode layer of 20 μm thick was formed at a squeegee speed of 150 mm/sec and dried at 150° C. Further, printing of an overlapping collector electrode layer was performed at 100 mm/sec in Comparative Example or at 200 mm/sec in Example. In each run, the printed paste was dried at 150° C., yielding a final printed electrode having a thickness of 30 μm. The thus treated substrate was admitted in a firing furnace where the conductive paste was fired at a maximum temperature of 800° C. to form an electrode, completing a solar cell. Electrical properties of these solar cells were measured as well as the takt time of printing.

By following the above procedure, ten solar cell samples were manufactured in each of Example and Comparative Example. Table 1 shows average values of electrical properties of the solar cell samples and the takt time of printing.

TABLE 1

| | Short-circuit current (mA/cm$^2$) | Open-circuit voltage (mV) | Fill factor (%) | Conversion efficiency (%) | Takt time of printing (sec/electrode) |
|---|---|---|---|---|---|
| Example 1 | 34.4 | 625 | 78.0 | 16.8 | 6.0 |
| Comparative Example 1 | 34.3 | 623 | 77.4 | 16.5 | 8.0 |

As is evident from Table 1, when solar cells are manufactured using the screen printing schedule according to the invention, improvements in electrical properties (e.g., 0.3% as absolute value in conversion efficiency) are observed, as compared with Comparative Example. A 0.3% improvement of conversion efficiency is achieved simply by changing the squeegee speed, which is evaluated to be a great contribution to the cell conversion efficiency which is increased by combining a variety of parameters in a cumulative way. In addition, the takt time of printing is not prolonged, leading to a saving of manufacture cost.

Example 2 and Comparative Example 2

Once a p-type silicon substrate was prepared as in Example 1, a collector electrode was formed on its front surface by screen printing of a conductive silver paste. A first layer was formed at a squeegee speed of 150 mm/sec to a thickness of 20 μm; a second layer was formed at a squeegee speed of 200 mm/sec to a thickness of 12 μm; a third layer was formed at a squeegee speed of 250 mm/sec to a thickness of 8 μm. The final printed electrode had a thickness of 40 μm.

Electrical properties of the resulting solar cells are shown in Table 2 together with the takt time of printing.

For comparison purpose, an electrode having a total thickness of 40 μm was formed by printing at a squeegee speed of 150 mm/sec for the first layer, a squeegee speed of 100 mm/sec for the second layer, and a squeegee speed of 90 mm/sec for the third layer. Electrical properties of the resulting solar cells are also shown in Table 2 together with the takt time of printing.

TABLE 2

| | Conversion efficiency (%) | Takt time of printing (sec/electrode) |
|---|---|---|
| Example 2 | 16.7 | 8.0 |
| Comparative Example 2 | 16.4 | 10.0 |

The invention claimed is:

1. A method for manufacturing a solar cell having a collector electrode, comprising
   forming the collector electrode by the following steps (i) screen printing of a conductive metal paste containing a metal, glass frit and varnish at a collector electrode-forming site, (ii) heating up to dry the conductive paste, in which the steps (i) and (ii) are repeated plural times in an overlapping manner during the screen printing, and subsequently (iii) firing the conductive metal paste at a temperature of 500 to 950° C.,
   wherein in the first screen printing step, the work to be printed is a semiconductor substrate, and in the second and later screen printing steps, the work to be printed is a layer of the dried conductive metal paste formed by the screen printing step and the heating up step,
   wherein the squeegee speed during the first screen printing step is 150 to 300 mm/sec, and
   wherein the squeegee speed during the second and later screen printing steps is higher than the squeegee speed during the first screen printing step, such that printing the second and subsequent layers facilitates removal of a printing plate from the conductive metal paste and an underlay and increases a buildup of paste, and the resulting collector electrode has an increased thickness and a reduced resistance value, whereby electrical properties of the solar cell are enhanced.

2. The method of claim 1 wherein the value obtained by subtracting the squeegee speed during the first screen printing step from the squeegee speed during the second and later screen printing steps is 10 mm/sec to 100 mm/sec.

3. A solar cell manufactured by the method of claim 1.

4. A solar cell manufactured by the method of claim 2.

5. The method of claim 1, further comprising forming an antireflection/passivation film on the front surface of a semiconductor substrate before forming the collector electrode,
wherein the collector electrode is formed by screen printing of the conductive metal paste on the antireflection/passivation film.

6. The method of claim 5, wherein the semiconductor substrate is a p-type silicon substrate having an n-type diffusion layer on the front surface.

7. The method of claim 1 wherein the enhancement of electrical properties of the solar cell are caused by the reduction of the resistance value of the collector electrode.

8. The method of claim 1 wherein a mesh screen used in screen printing bears the same pattern for all steps of screen printing.

9. The method of claim 1 wherein a layer of collector electrode is formed by each screen printing step so as to have a thickness of 5 to 50 µm.

10. The method of claim 2, wherein in third and later screen printing steps, the difference between the squeegee speed of a screen printing step and the squeegee speed of the preceding screen printing step is 10 mm/sec to 100 mm/sec.

* * * * *